(12) United States Patent
Harikai et al.

(10) Patent No.: US 11,682,575 B2
(45) Date of Patent: Jun. 20, 2023

(54) PLASMA PROCESSING APPARATUS, PLASMA PROCESSING METHOD, AND ELEMENT CHIP MANUFACTURING METHOD

(71) Applicant: Panasonic Intellectual Property Management Co., Ltd., Osaka (JP)

(72) Inventors: Atsushi Harikai, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 390 days.

(21) Appl. No.: 17/116,008

(22) Filed: Dec. 9, 2020

(65) Prior Publication Data

US 2021/0202289 A1  Jul. 1, 2021

(30) Foreign Application Priority Data

Dec. 27, 2019 (JP) .............................. JP2019-239420

(51) Int. Cl.
  *H01L 21/683* (2006.01)
  *H01L 21/3065* (2006.01)
  *H01L 21/687* (2006.01)
  *H01J 37/32* (2006.01)
  (Continued)

(52) U.S. Cl.
  CPC .... *H01L 21/6833* (2013.01); *H01J 37/32715* (2013.01); *H01L 21/3065* (2013.01); *H01L 21/31116* (2013.01); *H01L 21/6836* (2013.01); *H01L 21/68742* (2013.01);
  (Continued)

(58) Field of Classification Search
  CPC . H01L 21/6831–6833; H01L 21/68714; H01L 21/68742; H01L 21/6836; G03F 7/70708; H01J 37/32715
  See application file for complete search history.

(56) References Cited

U.S. PATENT DOCUMENTS 6,185,085 B1 * 2/2001 Hwang ............. H01L 21/68707
                                                          361/234
2005/0163598 A1 * 7/2005 Yuasa ............... H01L 21/68707
                                                          414/217
(Continued)

FOREIGN PATENT DOCUMENTS

JP       2015-225890 A       12/2015

*Primary Examiner* — Alia Sabur
(74) *Attorney, Agent, or Firm* — Pearne & Gordon LLP

(57) ABSTRACT

A plasma processing apparatus for plasma processing a substrate held on a conveying carrier, the carrier including a holding sheet and a frame supporting an outer periphery of the holding sheet. The apparatus includes a controller that controls a plasma generator, an electrostatic adsorption mechanism, and a lifting system, to sequentially execute: an adsorption step allowing the substrate to be adsorbed electrostatically to a stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of separating the holding sheet away from the stage; and a static elimination step of exposing the substrate separated away from the stage to a static elimination plasma.

8 Claims, 17 Drawing Sheets

(51) Int. Cl.
*H01L 21/311* (2006.01)
*H01L 21/78* (2006.01)

(52) U.S. Cl.
CPC ........ *H01L 21/78* (2013.01); *H01J 2237/334* (2013.01); *H01L 2221/68327* (2013.01)

(56) References Cited

U.S. PATENT DOCUMENTS

| | | | |
|---|---|---|---|
| 2014/0242780 A1* | 8/2014 | Gauldin | H01L 21/3065 438/463 |
| 2015/0340203 A1 | 11/2015 | Matsubara et al. | |
| 2016/0293381 A1* | 10/2016 | Okita | H01J 37/32733 |
| 2016/0293456 A1* | 10/2016 | Okita | H01L 21/6836 |

* cited by examiner

PLASMA PROCESSING APPARATUS, PLASMA PROCESSING METHOD, AND ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-239420 filed on Dec. 27, 2019, of which entire content is incorporated herein by reference into the present application.

TECHNICAL FIELD

The present invention relates to a plasma processing apparatus, a plasma processing method, and an element chip manufacturing method.

BACKGROUND

One known method for dicing a substrate is plasma dicing. Plasma dicing is a process of plasma-etching a substrate having a resist mask formed thereon, to dice the substrate into individual chips. For improving the ease of handling of the substrate or element chips during conveying or at the time of pickup in the plasma dicing process, there has been proposed using a conveying carrier to hold the substrate thereon. The conveying carrier includes a holding sheet and a frame supporting the periphery of the holding sheet.

When plasma processing is performed while the substrate is held on the conveying carrier, usually, the substrate is adsorbed together with the holding sheet to the stage of a plasma processing apparatus, by an electrostatic adsorption mechanism called an electrostatic chuck. The electrostatic adsorption mechanism applies a voltage to an electrostatic chuck electrode (hereinafter, ESC electrode) arranged inside the stage, and fixes the substrate to be adsorbed to the stage by a Coulomb force or a Johnson-Rahbek force that acts between the ESC electrode, and the substrate and the holding sheet. After the plasma processing, the residual static charge is eliminated from the substrate and the holding sheet, and then, the conveying carrier is delivered out of the plasma processing apparatus.

Patent Literature 1 (JP 2015-225890) teaches supplying a static elimination gas between the stage and the holding sheet, or exposing the substrate to a static elimination plasma, thereby to eliminate the static charge. Thereafter, the conveying carrier is lifted from the stage to be separated away therefrom.

When a plasma is used for static elimination, not only the substrate but also the holding sheet is exposed to the plasma. Therefore, the holding sheet is heated and may be degraded. Furthermore, when the frame is lifted while the holding sheet is in a heated state, the holding sheet may stretch and snap, leaving a crack. Moreover, wrinkles may occur when the stretched holding sheet is cooled and shrinks. A crack or wrinkles in the holding sheet, if any, makes an accurate recognition of the chips difficult in a pickup step after plasma processing, tending to cause a pickup error. Especially when the substrate is thick or has an oxide film, the plasma processing time tends to be prolonged. This results in an increased residual static charge in the substrate because the substrate is kept adsorbed electrostatically all through the processing. In order to eliminate static from the substrate in such a state, the substrate needs to be exposed to a static elimination plasma generated at a high power, increasing the possibility that the holding sheet may be degraded.

SUMMARY

One aspect of the present invention relates to a plasma processing apparatus for plasma processing a substrate held on a conveying carrier, the conveying carrier including a holding sheet, and a frame supporting an outer periphery of the holding sheet, the substrate being attached to the holding sheet, the plasma processing apparatus comprising: a reaction chamber; a plasma generator for generating a plasma within the reaction chamber; a stage for mounting the conveying carrier, the stage arranged inside the reaction chamber; an electrostatic adsorption mechanism including an electrode part arranged inside the stage; a support for supporting the frame; a lifting system for lifting and lowering the support; and a controller for controlling the plasma generator, the electrostatic adsorption mechanism, and the lifting system, wherein the controller controls the plasma generator, the electrostatic adsorption mechanism, and the lifting system, to sequentially execute: an adsorption step of applying a voltage to the electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

Another aspect of the present invention relates to a plasma processing method for plasma processing a substrate held on a conveying carrier, the conveying carrier including a holding sheet and a frame supporting an outer periphery of the holding sheet, the substrate being attached to the holding sheet, the plasma processing method comprising: an adsorption step of applying a voltage to an electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

Still another aspect of the present invention relates to an element chip manufacturing method comprising: a preparation process of preparing a conveying carrier and a substrate, the conveying carrier including a holding sheet and a frame supporting an outer periphery of the holding sheet, the substrate being held on the holding sheet and segmented into a plurality of element regions and a plurality of dicing regions, and having a first principal surface and a second principal surface attached to the holding sheet; and a plasma dicing process of exposing the substrate to an etching plasma, to remove the dicing regions from the substrate to dice the substrate into a plurality of element chips, the plasma dicing process including: an adsorption step of applying a voltage to an electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

According to the present invention, heat-caused deterioration of the holding sheet used for conveying the substrate can be suppressed.

DETAILED DESCRIPTION

Figure 1:
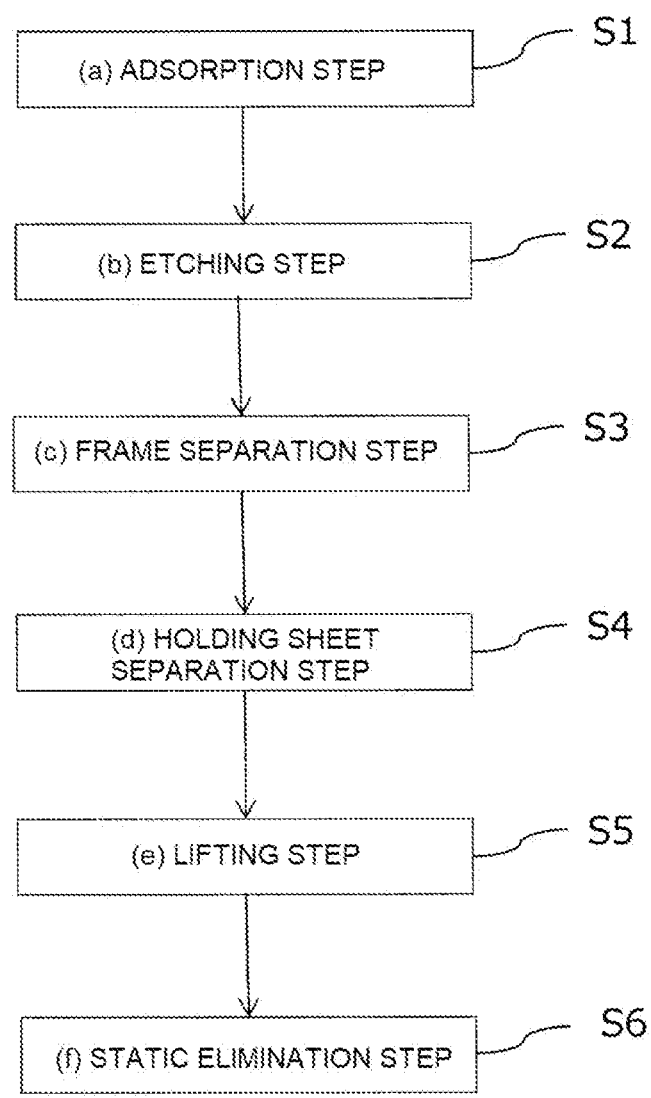
FIG. 1 is a flowchart of a plasma processing method according to an embodiment of the present invention.

In the plasma processing apparatus according to the present embodiment, when eliminating static from the substrate, the frame is lifted first from the stage. The frame is usually rigid and made of a material in which static buildup hardly occurs, such as metal, and therefore, the frame can be lifted smoothly. Next, in this state, a voltage is applied to the electrode part provided in the stage, to generate a repulsive force between the substrate and the electrode part. This can separate the holding sheet away from the stage, without the holding sheet being subjected to excessive load. Since these steps are performed in a reaction chamber in which no plasma is generated, the holding sheet is unlikely to undergo deterioration by heat. Subsequently, the substrate is exposed to a static elimination plasma. However, since the substrate and the holding sheet are already separated away from the stage, the static buildup is reduced to a low level. Therefore, the static elimination treatment can be completed in a short time and with a low power. In other words, according to the present embodiment, the static elimination treatment can be performed under the conditions that can minimize thermal impacts.

The plasma processing method according to the present embodiment is executed by the above plasma processing apparatus. The present embodiment encompasses such a plasma processing method. The plasma processing method according to the present embodiment is particularly suitable as a method of manufacturing element chips by plasma dicing. The present embodiment encompasses an element chip manufacturing method including a plasma dicing process.

A. Plasma Processing Apparatus

The plasma processing apparatus according to the present embodiment performs plasma processing on a substrate held on a conveying carrier. The conveying carrier includes a holding sheet and a frame supporting an outer periphery of the holding sheet. The substrate is attached to the holding sheet. The plasma processing apparatus includes: a reaction chamber; a plasma generator for generating a plasma within the reaction chamber; a stage for mounting the conveying carrier, the stage arranged inside the reaction chamber; an electrostatic adsorption mechanism including an electrode part arranged inside the stage; a support for supporting the frame; a lifting system for lifting and lowering the support; and a controller for controlling the plasma generator, the electrostatic adsorption mechanism, and the lifting system.

The controller controls the plasma generator, the electrostatic adsorption mechanism, and the lifting system, to sequentially execute: an adsorption step of applying a voltage to the electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

B. Plasma Processing Method

The plasma processing method according to the present embodiment performs plasma processing on a substrate held on a conveying carrier. The conveying carrier includes a holding sheet and a frame supporting an outer periphery of the holding sheet. The substrate is attached to the holding sheet. The plasma processing method includes: an adsorption step of applying a voltage to the electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

FIG. 1 is a flowchart of the plasma processing method according to the present embodiment.

(Substrate)

The substrate is a subject of plasma processing. The substrate, for example, has a first principal surface and a second principal surface, and is segmented into a plurality of element regions and a plurality of dicing regions. The dicing regions define the element regions. The substrate includes, for example, a semiconductor layer. The element regions of the substrate may further include a wiring layer. The dicing regions of the substrate may further include an electrically insulating film and a metal material, such as TEG (Test Element Group). Etching the substrate along the dicing regions provides element chips.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 μm or more and 1000 μm or less, and may be 100 μm or more and 300 μm or less.

The wiring layer constitutes, for example, a semiconductor circuit, an electronic component element, or MEMS, and may include an electrically insulating film, a metal material, a resin layer (e.g., polyimide), a resist layer, an electrode pad, a bump, and others. The insulating film may be in the form of a laminate with a wiring metal material (multilevel wiring layer or redistribution layer).

The substrate may be of any size, and is, for example, about 50 mm or more and 300 mm or less in maximum diameter. The substrate may be of any shape, and is, for example, circular or rectangular. The substrate may be provided with a cut, such as an orientation flat or a notch.

The shape of the dicing regions may be set as appropriate according to a desired shape of element chips, without limited to a straight linear shape, and may be, for example, a zig-zag shape or a wavy line shape. Note that the shape of element chips is, for example, rectangular or hexagonal.

The width of the dicing regions may be set as appropriate depending on the size of the substrate or the element chips, and others. The width of the dicing regions is, for example, 10 μm or more and 300 μm or less. A plurality of the dicing regions may have the same width or different widths. The dicing region is typically formed in plural numbers on the substrate. The pitch between the dicing regions adjacent to each other also is not limited, and may be set as appropriate depending on the size of the substrate or the element chips, and others.

(Conveying Carrier)

The conveying carrier includes a holding sheet and a frame supporting the outer periphery of the holding sheet.

The frame is a frame member having an opening equal to or greater in area than the whole substrate. The frame has a predetermined width and a thickness which is substantially consistently thin. The frame has such a rigidity that it can be conveyed with the holding sheet and the substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the substrate thereto, the holding sheet preferably includes an adhesive layer and a non-adhesive layer with flexibility.

The non-adhesive layer may be made of any material, and may be, for example, a thermoplastic resin, such as polyolefin (e.g., polyethylene, polypropylene), and polyester (e.g., polyvinyl chloride, polyethylene terephthalate). The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The above thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover an opening of the frame. On the adhesive side exposed from the opening of the frame, the substrate is attached, with one of its principal surfaces (second principal surface) in contact with the adhesive side. The substrate is thus held on the holding sheet. The substrate may be held on the holding sheet via a die attach film (DAF).

The adhesive layer is preferably made of an adhesive component, the adhesive strength of which is reduced by ultraviolet (UV) irradiation. In this case, when picking up element chips after plasma dicing, the element chips can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).

Figure 2A:
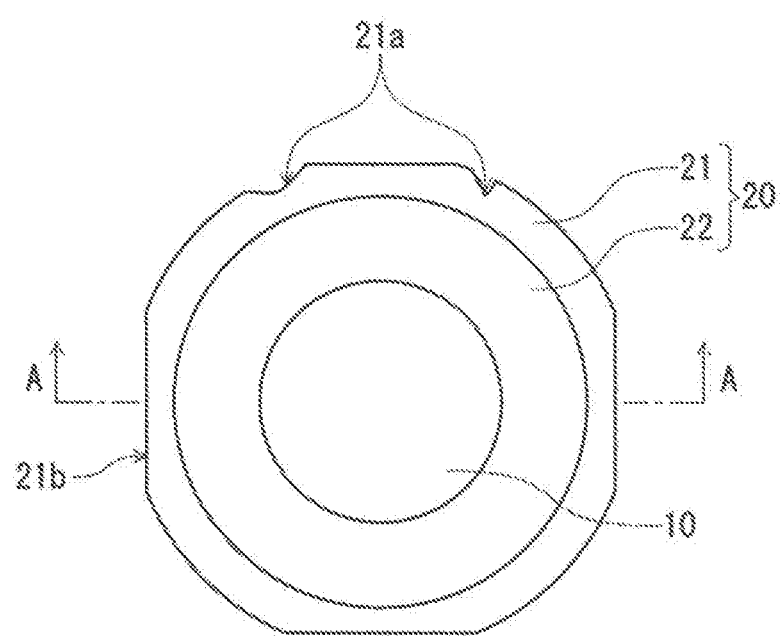
FIG. 2A is a schematic top view of a conveying carrier and a substrate held thereon according to an embodiment of the present invention.
Figure 2B:
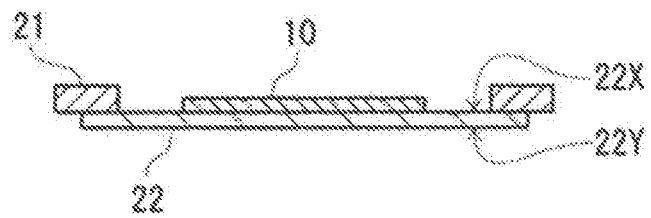
FIG. 2B is a cross-sectional view taken along a line A-A in FIG. 2A.

FIG. 2A is a schematic top view of the conveying carrier and a substrate held thereon. FIG. 2B is a cross-sectional view taken along a line A-A in FIG. 2A.

A conveying carrier 20 includes a holding sheet 22 and an annular frame 21 supporting an outer periphery of the holding sheet 22. The frame 21 may be provided with a notch 21a and a corner cut 21b for correct positioning. An adhesive side 22X is attached at its periphery to one side of the frame 21, and on a portion of the adhesive side 22X exposed from the frame 21, one of the principal surfaces of a substrate 10 is attached.

(Reaction Chamber)

The reaction chamber (hereinafter, vacuum chamber) is approximately cylindrical in shape, with the top open. The open top of the vacuum chamber is closed with a dielectric member serving as a lid. Above the dielectric member, an upper electrode (first electrode) is disposed. The first electrode is electrically connected to a high-frequency power source (first high-frequency power source).

The vacuum chamber is provided with a gas inlet and a gas outlet. The gas inlet is connected to a process gas source, which is a plasma-generating gas (process gas) supply source. The gas outlet is connected to a decompression system including a vacuum pump for exhausting gas from the vacuum chamber to reduce the pressure therein.

Examples of the constituent material of the vacuum chamber include aluminum, stainless steel (SUS), and aluminum with anodic oxide coating. Examples of the constituent material of the dielectric member include yttrium oxide ($Y_2O_3$), aluminum nitride (AlN), alumina ($Al_2O_3$), quartz ($SiO_2$), and other dielectric materials.

(Plasma Generator)

The plasma generator consists of the first electrode, the process gas source, and the first high-frequency power source.

While the vacuum chamber is supplied with a process gas, a high-frequency power is supplied to the first electrode from the first high-frequency power source. A plasma is thus generated in the vacuum chamber.

(Stage)

The stage is arranged on the bottom side in the vacuum chamber.

The stage has such a size that the whole conveying carrier can be seated thereon. The conveying carrier is placed on the stage, with the surface of the holding sheet holding the substrate faced upward.

(Electrostatic Adsorption Mechanism)

The electrostatic adsorption mechanism consists of an electrode part arranged inside the stage (hereinafter, ESC electrode), and a DC power source connected to the ESC electrode. Upon application of a voltage from the DC power source to the ESC electrode, a Coulomb force or a Johnson-Rahbek force is generated between the stage, and the substrate and the holding sheet (hereinafter, sometimes, "substrate etc."), allowing the substrate to be adsorbed to the stage.

The ESC electrode can be categorized into two types: a monopolar type, and a bipolar type.

A monopolar ESC electrode includes at least one electrode, and a voltage or voltages with the same potential are applied to the at least one electrode. An electrostatic adsorption mechanism including the monopolar ESC electrode uses a Coulomb force as the adsorption mechanism. Upon application of a voltage to the ESC electrode, an electrical charge due to dielectric polarization is induced on the surface of the stage comprising a dielectric. At this time, when static electricity is allowed to build up in the substrate etc. placed on the stage, a Coulomb force acts between the induced charge on the surface of the stage and the statically electrified substrate etc., fixing the substrate to be adsorbed to the stage. Static electricity can be allowed to build up in the substrate etc. by generating a plasma within the vacuum chamber, and exposing the substrate etc. to the plasma.

On the other hand, a bipolar ESC electrode includes a positive electrode and a negative electrode, and voltages with different potentials are respectively applied to the positive electrode and the negative electrode. The bipolar ESC electrode is, for example, an interdigital electrode.

An electrostatic adsorption mechanism including the bipolar ESC electrode utilizes a Coulomb force or a Johnson-Rahbek force as the adsorption mechanism. Depending on the adsorption mechanism to be used, the structure of the electrode and the material (e.g., ceramics) constituting the electrode are selected as appropriate. Whichever adsorption mechanism is used, by applying voltages having different polarities respectively to the positive electrode and the negative electrode, an adsorption force is generated between the ESC electrode and the substrate etc., and the substrate can be adsorbed to the stage. Note that in the case of the bipolar type, unlike the monopolar type, no static electricity buildup in the substrate etc. is necessary for adsorption.

The bipolar ESC electrode may be made function as a monopolar type depending on how a voltage is applied to the positive electrode and the negative electrode. Specifically, by applying voltages having the same polarity respectively to the positive electrode and the negative electrode, the bipolar ESC electrode can be used as a monopolar ESC electrode. Hereinafter, applying voltages having different polarities respectively to the positive and negative electrodes of the bipolar ESC electrode is referred to as a bipolar mode, and applying voltages having the same polarity to the positive and negative electrodes is referred to as a monopolar mode. Whichever is used, the monopolar type or the bipolar type, the conveying carrier can be adsorbed to the stage. In the following, the present embodiment will be described in details, with reference to a case where the ESC electrode is of the bipolar type.

The ESC electrode is arranged such that its center substantially matches with the center of the stage. The center of the ESC electrode is the center of a smallest perfect circle that completely surrounds the ESC electrode. The ESC electrode is preferably arranged at a position not facing the frame. In this case, the frame is more unlikely to be statically electrified, which makes it easy to lift the frame with a smaller load in the frame separation step. The load applied to the holding sheet in the frame separation step is therefore reduced.

Figure 3:
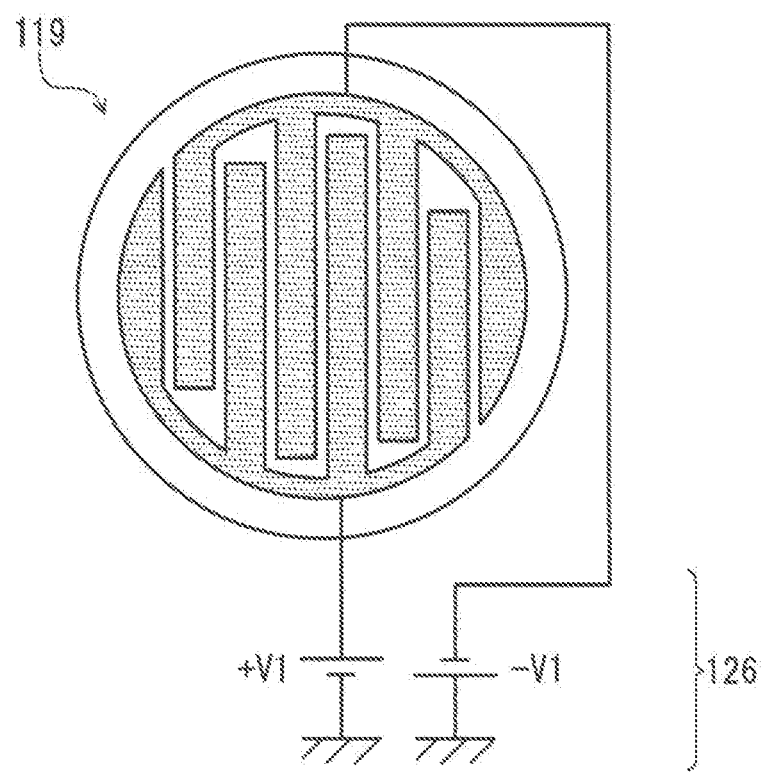
FIG. 3 is a conceptual diagram showing a relationship between a bipolar ESC electrode and a DC power source according to an embodiment of the present invention.

FIG. 3 is a conceptual diagram showing a relationship between the bipolar ESC electrode and the DC power source according to the present embodiment. An ESC electrode 119 is an interdigital electrode, in which a voltage of +V1 is applied to the positive electrode, and a voltage of −V1 is applied to the negative electrode.

(Support and Lifting system)

The support is arranged, for example, so as to penetrate through the stage in the vicinity of its outer circumference. The support is usually provided in a plurality of numbers at equal intervals. The supports support the frame of the conveying carrier. The supports are driven to move up and down by the lifting system. As the supports are moved up and down, the conveying carrier moves up and down, from and to the stage.

(Controller)

The controller includes, for example, a computer, and controls the plasma generator, the electrostatic adsorption mechanism, and the lifting system.

Figure 4:
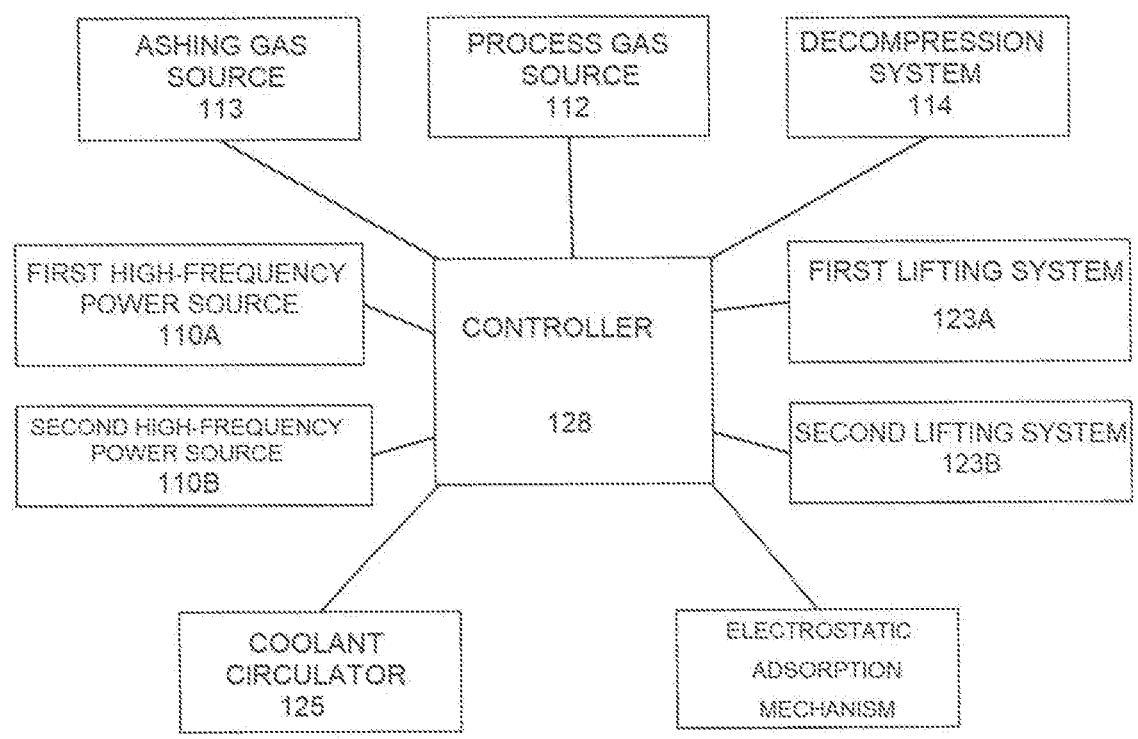
FIG. 4 is a block diagram of a plasma processing apparatus used in an embodiment of the present invention.

FIG. 4 is a block diagram of an example of the plasma processing apparatus used in the present embodiment.

A controller 128 controls the plasma generator including a first high-frequency power source 110A and a process gas source 112, a first lifting system 123A, and the electrostatic adsorption mechanism. The controller 128 further controls the operation of the following units provided in the plasma processing apparatus: a second high-frequency power source 110B, an ashing gas source 113, a decompression system 114, a coolant circulator 125, and a second lifting system 123B. A detailed description will be given later of the second high-frequency power source 110B and other units.

Figure 5:
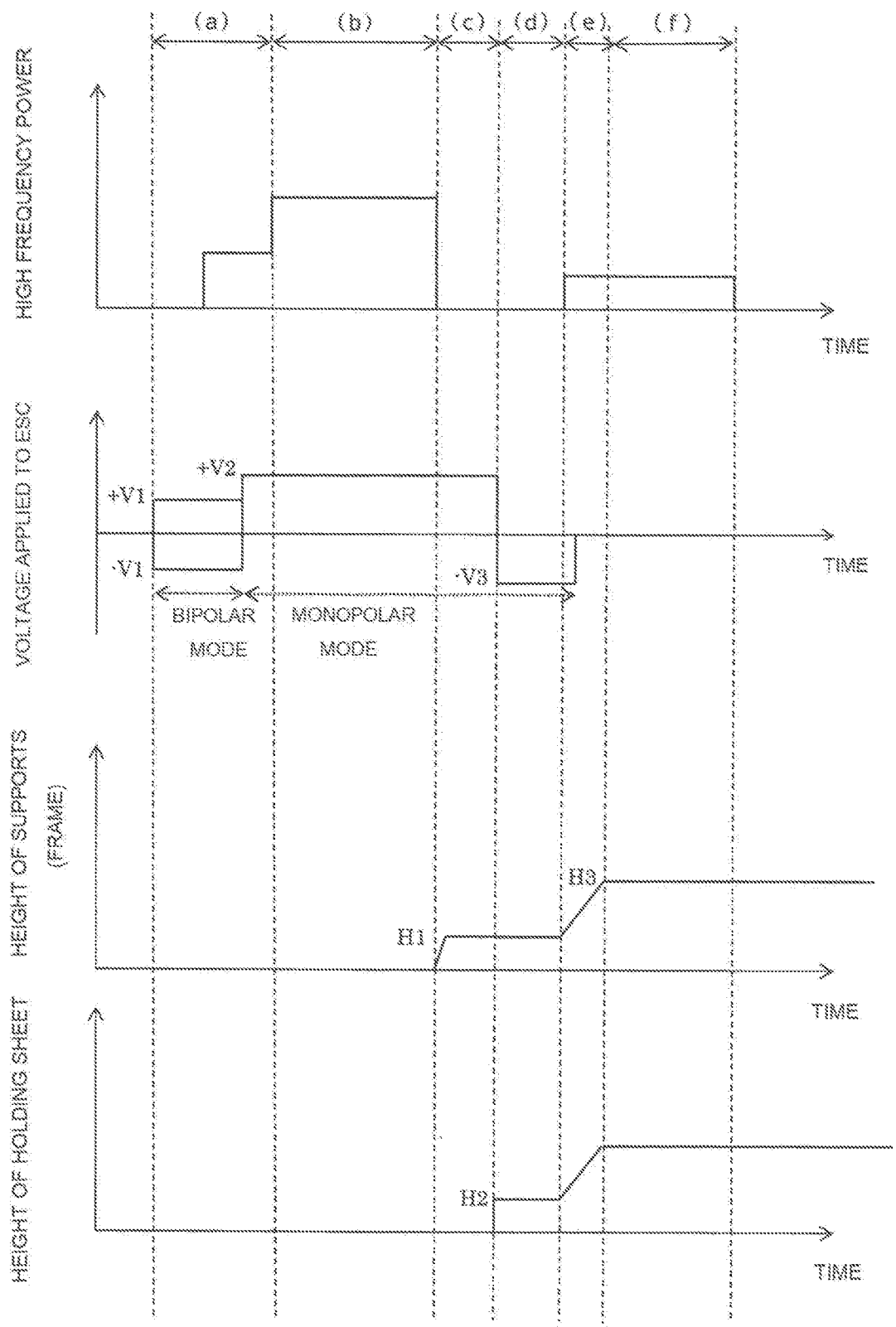
FIG. 5 is a conceptual graph with time on the horizontal axis, showing an exemplary operation of the plasma processing apparatus according to an embodiment of the present invention.

The controller controls the plasma generator, the electrostatic adsorption mechanism, and the lifting system, to sequentially execute an adsorption step, an etching step, a frame separation step, a holding sheet separation step, and a static elimination step. In the following, a description will be given of a case where a lifting step is further included. FIG. 5 is a conceptual graph with time on the horizontal axis, showing an exemplary operation of the plasma processing apparatus according to the present embodiment.

(a) Adsorption Step (S1)

Prior to the etching step, a substrate is adsorbed electrostatically to the stage. After the conveying carrier is placed on the stage, for example, the ESC electrode is activated in the bipolar mode, to fix the substrate to be adsorbed electrostatically to the stage. Specifically, the positive electrode of the ESC electrode is applied with, for example, a voltage of +V1, and the negative electrode thereof is applied with a voltage of −V1. The absolute value (V1) of the voltage of the ESC electrode applied for electrostatic adsorption is, for example, 500 V or more and 1500 V or less.

(b) Etching Step (S2)

The substrate held on the conveying carrier placed on the stage is exposed to an etching plasma. This provides a plurality of element chips.

The etching plasma can be generated by supplying a high-frequency power from the first high-frequency power source to the first electrode, while the vacuum chamber is supplied with an etching gas. At this time, a high-frequency power may be applied to an electrode (second electrode) incorporated in the stage, so that the stage is applied with a bias voltage.

The conditions for generating an etching plasma are dependent on the material of the substrate to be subjected to etching, and the like.

Examples of the etching plasma include: a fluorocarbon gas, such as $CF_4$ or $C_4F_8$; a fluorohydrocarbon gas, such as $CHF_3$; $SF_6$; a rare gas, such as Ar or He; and $O_2$. These may be used singly or in combination of two or more kinds thereof.

In the etching step, the ESC electrode may be operated in the monopolar mode. In other words, before starting to generate an etching plasma, the ESC electrode may be switched from the bipolar mode to the monopolar mode. The switching from the bipolar to the monopolar mode is implemented by, for example, reversing the polarity of the voltage applied to one of the positive and negative electrodes, or by varying the voltage applied to one of the positive and negative electrodes to be the same as that applied to the other electrode. In either case, voltages having the same polarity are applied to the positive and negative electrodes.

The absolute value (V2) of the voltage applied to the ESC electrode in the etching step may be larger than the absolute value (V1) of the voltage applied to the ESC electrode for electrostatic absorption. The absolute value (V2) of the voltage applied to the ESC electrode in the etching step is, for example, 1500 V or more and 3000 V or less.

Figure 6:
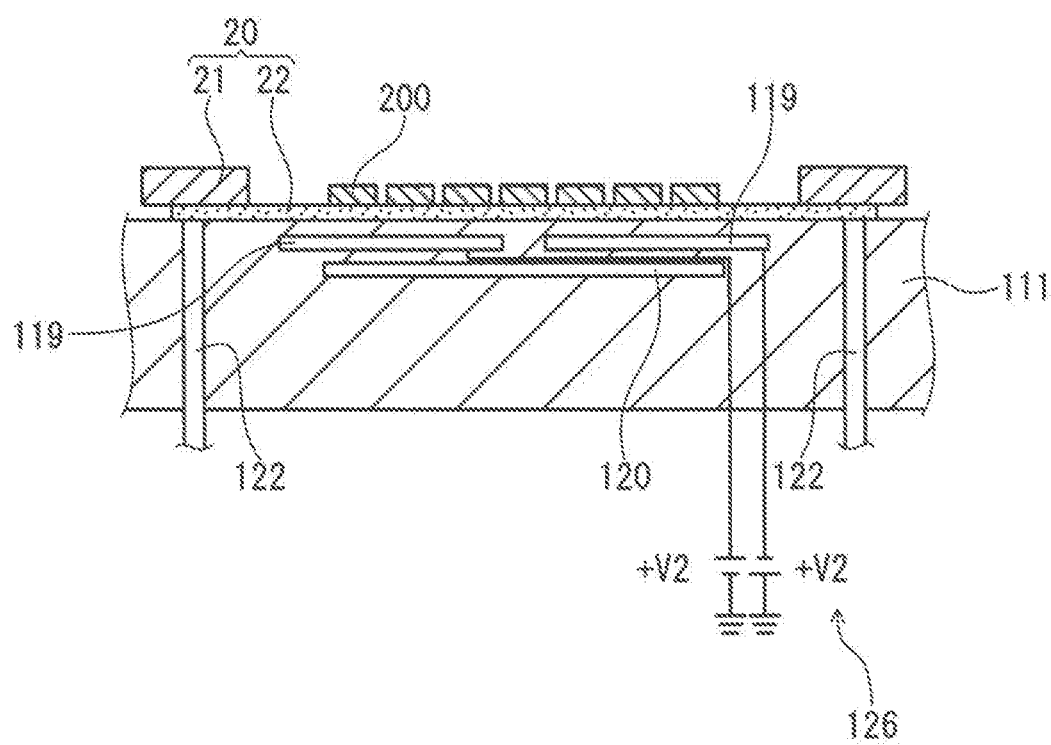
FIG. 6 is a schematic cross-sectional view showing an essential part of the plasma processing apparatus after an etching step according to an embodiment of the present invention.

FIG. 6 is a schematic cross-sectional view showing an essential part of the plasma processing apparatus after the etching step.

The conveying carrier 20 is placed on a stage 111. The conveying carrier 20 holds a plurality of element chips 200 produced from the substrate by etching. The stage 111 incorporates the ESC electrode 119. The ESC electrode 119 is an interdigital electrode, and the positive electrode and the negative electrode are applied with the same voltage (+V2).

In the vicinity of the outer circumference of the stage 111, a plurality of supports 122 are arranged, so as to penetrate through the stage 111. The supports 122 support the frame 21 of the conveying carrier 20. The stage 111 further incorporates a second electrode 120. Through the second electrode 120, a bias voltage can be applied to the stage 111.

(c) Frame Separation Step (S3)

The supports are lifted, so that the frame is separated away from the stage. Here, at least part of the holding sheet is kept in contact with the stage. Since the frame is only slightly lifted, the holding sheet is unlikely to be subjected to excessive load. A shortest distance H1 between the stage-facing side of the frame and the stage is, for example, 1 mm or more and 5 mm or less.

In the frame separation step, the same voltage (V2) as that applied in the etching step may be applied to the ESC electrode.

Figure 7:
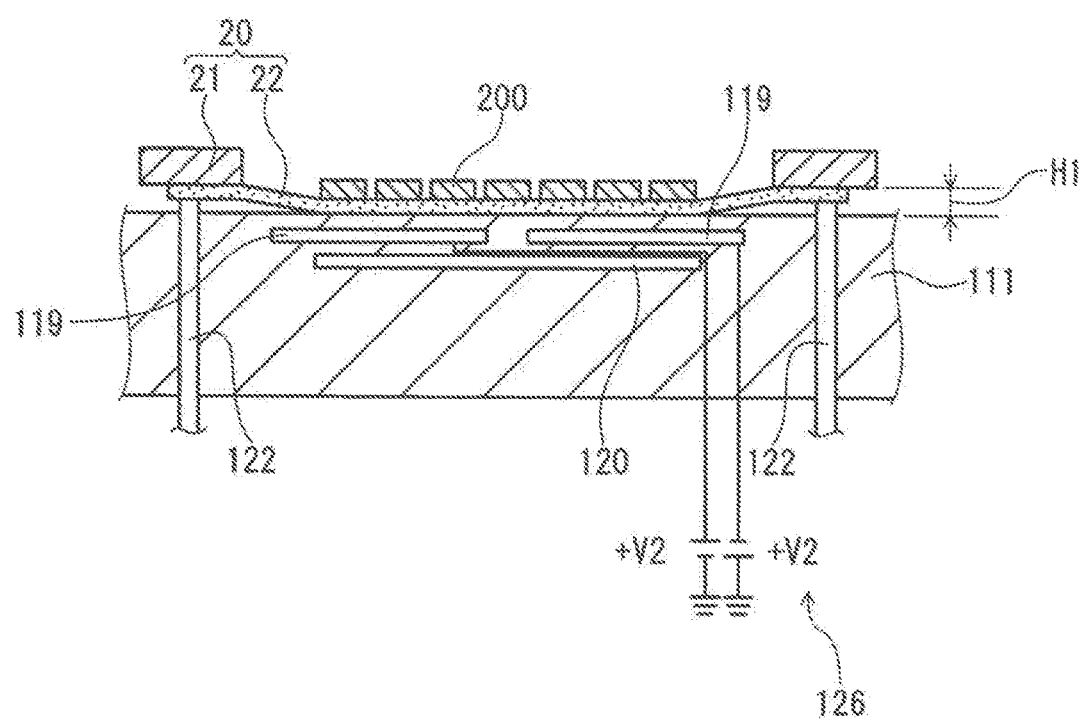
FIG. 7 is a schematic cross-sectional view showing an essential part of the plasma processing apparatus after a frame separation step according to an embodiment of the present invention.

FIG. 7 is a schematic cross-sectional view showing an essential part of the plasma processing apparatus after the frame separation step according to the present embodiment. The supports 122 are lifted, and the frame 21 is separated away from the stage 111. On the other hand, the holding sheet 22 is partially in contact with the stage 111. The positive and negative electrodes of the ESC electrode 119 are still applied with the voltage of +V2.

(d) Holding Sheet Separation Step (S4)

A voltage that generates a repulsive force between the substrate and the electrode part is applied to the electrode part. This causes the holding sheet to be separated away from the stage. At this time, no plasma is generated in the vacuum chamber, and the holding sheet is not heated. Therefore, even when separated away from the stage, the holding sheet is unlikely to be stretched. Furthermore, since the frame is already separated away from the stage, the above repulsive force exerted on the substrate effectively acts to separate the holding sheet. A shortest distance H2 between the stage-facing side of the holding sheet and the stage is equal to or less than the shortest distance H1.

The voltage applied to the electrode part in the holding sheet separating step has, for example, a polarity different from that of the voltage applied to the electrode part in the etching step. The above repulsive force can be easily generated by switching the polarity of the voltage. The switching of the polarity can be implemented by, for example, reversing the polarity of the voltage applied to the electrode part in the etching step, without changing its absolute value (V2), or varying the voltage having a positive polarity until it has a negative polarity. An absolute value (V3) of the voltage applied to the electrode part in the holding sheet separation step may be the same as or different from the absolute value (V2) of the voltage applied to the electrode part in the etching step. The absolute value (V3) of the voltage applied to the electrode part in the holding sheet separation step is, for example, −2000 V or more and −300 V or less.

Figure 8:
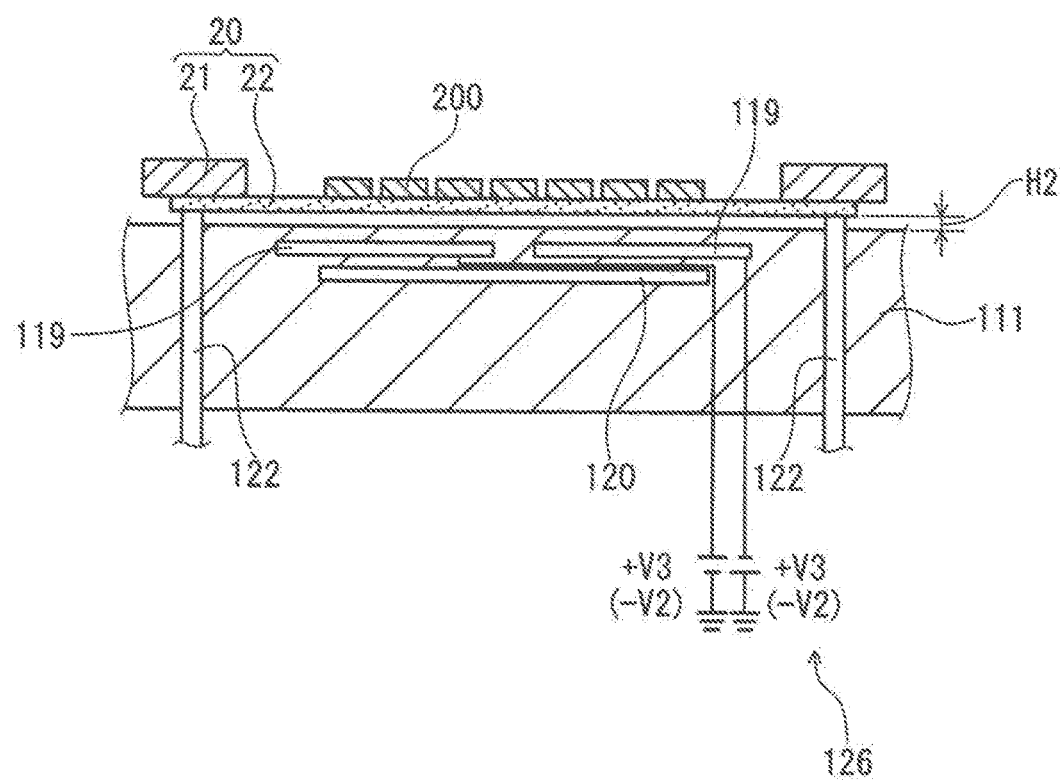
FIG. 8 is a schematic cross-sectional view showing an essential part of the plasma processing apparatus after a holding sheet separation step according to an embodiment of the present invention.

FIG. 8 is a schematic cross-sectional view showing an essential part of the plasma processing apparatus after the holding sheet separation step according to the present embodiment. The positive electrode and the negative electrode of the ESC electrode 119 are applied with a voltage (−V2) having a polarity opposite to that of the voltage (+V2) applied to the electrode part in the etching step. This generates a repulsive force between the holding sheet 22 and the stage 111, so that the holding sheet 22 is separated away from the stage 111.

(e) Lifting Step (S5)

After the holding sheet separation step and before the static elimination step, the support may be further lifted. This further lowers the level of the static buildup in the substrate etc., which can make it possible to complete the static elimination treatment in a shorter time and with a lower power. A shortest distance H3 between the stage-facing side of the frame and the stage may be, for example, 10 mm or more, and 15 mm or more.

(f) Static Elimination Step (S6)

The substrate supported above the stage is exposed to a static elimination plasma. Since the substrate etc. are already separated away from the stage, the static elimination step can be completed in a short time and with a low power. Therefore, deterioration of the holding sheet caused by heating can be suppressed.

The static elimination plasma desirably hardly etches the substrate and the holding sheet.

Examples of a process gas for generating the static elimination plasma include a rare gas, such as Ar or He. These may be used singly or in combination of two or more kinds thereof. The process gas may be supplied in an amount of, for example, 50 sccm or more and 200 sccm or less.

In the static elimination step, the pressure in the vacuum chamber is controlled to, for example, 5 Pa or more and 20 Pa or less. The power input from the first high-frequency power source to the first electrode is, for example, 50 W or more and 500 W or less. The treatment time is, for example, 5 s or more and 60 s or less.

During the static elimination step, no voltage may be applied to the ESC electrode. The voltage application to the ESC electrode may be stopped simultaneously with the generation of a static elimination plasma or after the static elimination plasma is generated.

Figure 9:
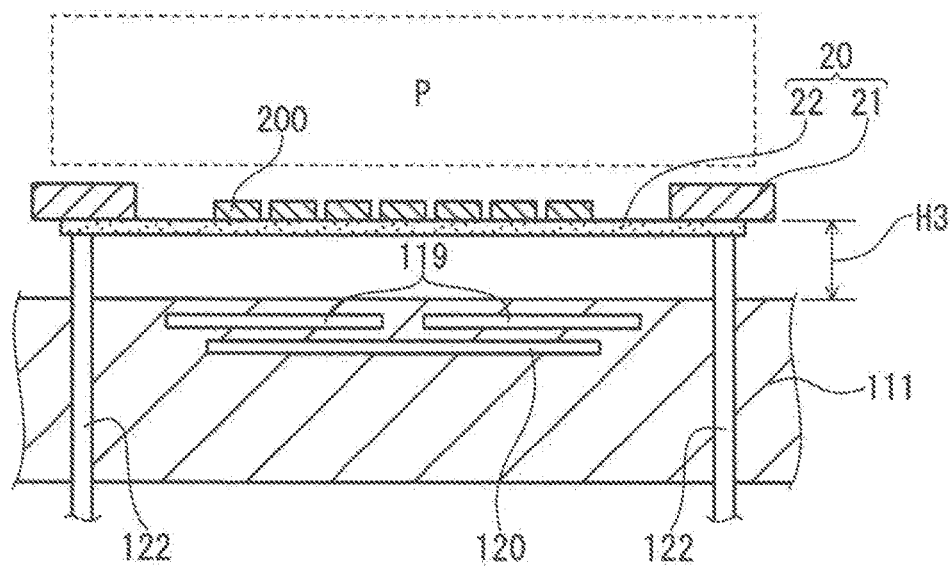
FIG. 9 is a schematic cross-sectional view showing an essential part of the plasma processing apparatus during a static elimination step according to an embodiment of the present invention.

FIG. 9 is a schematic cross-sectional view showing an essential part of the plasma processing apparatus during the static elimination step according to the present embodiment. The supports 122 have been further lifted before the static elimination step. In this state, a plurality of the element chips 200 are exposed to a static elimination plasma P.

The operation of the plasma processing apparatus according to the present embodiment will be specifically described below.

Figure 10:
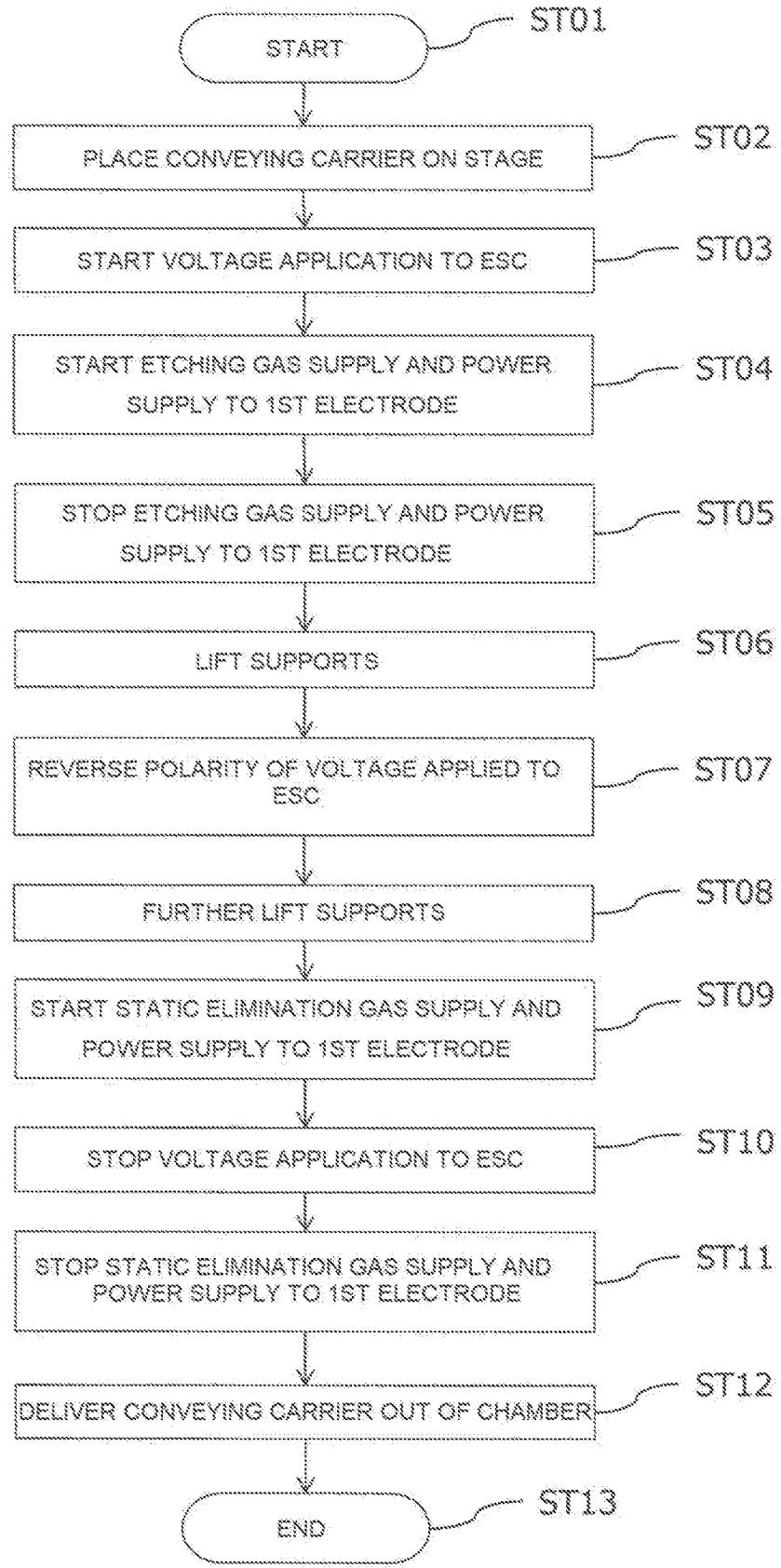
FIG. 10 is a flowchart of an operation of the plasma processing apparatus according to an embodiment of the present invention.

FIG. 10 is a flowchart of the operation of the plasma processing apparatus according to the present embodiment.

Upon start of the operation of the plasma processing apparatus (ST01), the substrate held on the conveying carrier is delivered into the vacuum chamber, with a transfer arm or the like. At this time, the supports are on standby at a raised position. When the conveying carrier reaches a predetermined position above the stage, the conveying carrier is passed onto the support. After the conveying carrier is situated on the support, the vacuum chamber is hermetically closed. Thereafter, the supports are lowered until their top surfaces become flush with or below the top surface of the stage. The conveying carrier is thus set on the stage (ST02).

Thereafter, a voltage is applied to the ESC electrode from the DC power source (ST03). This fixes the holding sheet and the substrate to be adsorbed electrostatically to the stage. The ESC electrode is operating in the bipolar mode. Note that the voltage application to the ESC electrode may be started after the conveying carrier is delivered into the chamber and before it is placed on the stage.

Subsequently, a gas for adsorption is supplied into the vacuum chamber, and a low power (e.g., 500 W or less) is supplied from the first high-frequency power source to the first electrode, thereby to generate a low-power plasma in the vacuum chamber. The ESC electrode is then switched from the bipolar to the monopolar mode. In this way, even during switching of the mode, the substrate can be stably kept adsorbed to the stage.

After the switching of the mode is completed, an etching gas is supplied into the vacuum chamber, and a high-frequency power is supplied from the first high-frequency power source to the first electrode (ST04). An etching plasma is thus generated in the vacuum chamber, and the substrate is plasma-etched.

Upon completion of a predetermined plasma etching, the supply of the etching gas and the power supply to the first electrode are stopped (ST05). The supports are then lifted (ST06), to separate the frame away from the stage. Here, at least part of the holding sheet is kept in contact with the stage. Subsequently, the polarity of the voltage applied to the monopolar mode ESC electrode is reversed (ST07). This generates a repulsive force between the substrate and the electrode part, causing the whole holding sheet to be separated away from the stage. After the holding sheet is separated, the support may be further lifted (ST08).

Subsequently, a static elimination gas is supplied into the vacuum chamber, and a high-frequency power is supplied from the first high-frequency power source to the first electrode (ST09). This generates a static elimination plasma in the vacuum chamber, so that the static charge is eliminated from the substrate and the holding sheet. When the static elimination plasma starts to generate, the voltage application to the ESC electrode is stopped (ST10). Upon completion of a predetermined static elimination treatment, the supply of the static elimination gas and the power supply to the first electrode are stopped (ST11).

The vacuum chamber is opened, and the conveying carrier is delivered out of the chamber by a transfer arm having entered the chamber (ST12), which ends the plasma processing (ST13). Before delivering the conveying carrier out of the chamber, the supports may be further lifted to a position approximately the same as that when it has been delivered into the chamber.

C. Element Chip Manufacturing Method

An element chip manufacturing method according to the present embodiment includes: a preparation process of preparing a conveying carrier and a substrate, the conveying carrier including a holding sheet and a frame supporting an outer periphery of the holding sheet, the substrate being held on the holding sheet and segmented into a plurality of element regions and a plurality of dicing regions, and having a first principal surface and a second principal surface attached to the holding sheet; and a plasma dicing process of exposing the substrate to an etching plasma, to remove the dicing regions from the substrate to dice the substrate into a plurality of element chips. The plasma dicing process includes: an adsorption step of applying a voltage to the electrode part while the conveying carrier holding the substrate is on the stage, to allow the substrate to be adsorbed electrostatically to the stage; an etching step of exposing the substrate adsorbed electrostatically to the stage to an etching plasma; a frame separation step of lifting the support, to separate the frame away from the stage, with at least part of the holding sheet kept in contact with the stage; a holding sheet separation step of applying to the electrode part a voltage that generates a repulsive force between the substrate and the electrode part, to separate the holding sheet away from the stage; and a static elimination step of exposing the substrate separated away from the stage to a static elimination plasma.

Figure 11:
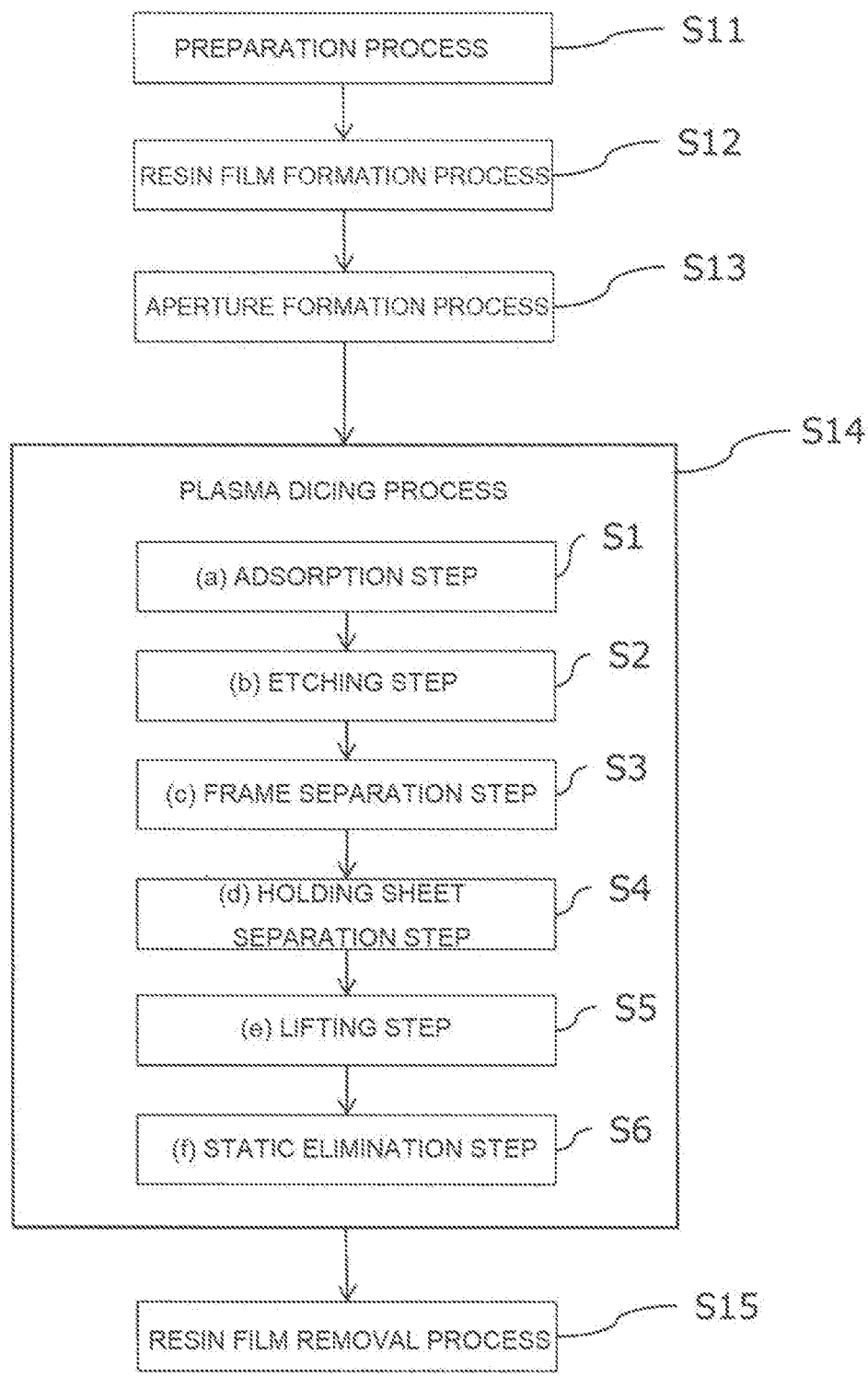
FIG. 11 is a flowchart of an element chip manufacturing method according to an embodiment of the present invention.

FIG. 11 is a flowchart of the element chip manufacturing method according to the present embodiment.

(1) Preparation Process (S11)

First, a substrate held on a conveying carrier is prepared. The shape, material, and the like of the substrate are as described above.

(2) Resin Film Formation Process (S12)

A resin film covering the first principal surface of the substrate is formed. The resin film is provided for protecting the element regions of the substrate from plasma exposure or the like.

The resin film contains, for example, a resist material, such as a thermosetting resin (e.g., polyimide), a photoresist (e.g., phenol resin), or a water-soluble resist (e.g., acrylic resin). The resin film can be formed by, for example, forming a resist material into a sheet and attaching the sheet to the substrate, or by applying a liquid raw material of a resist material to the substrate using spin-coating or spray-coating technique.

The resin film may have any thickness, but is preferably thick enough not to be completely removed in the plasma processing. The thickness of the resin film is set, for example, to be greater than a calculated amount (thickness) of the resin film to be etched in the plasma processing. The thickness of the resin film is, for example, 5 μm or more and 60 μm or less.

Figure 12:
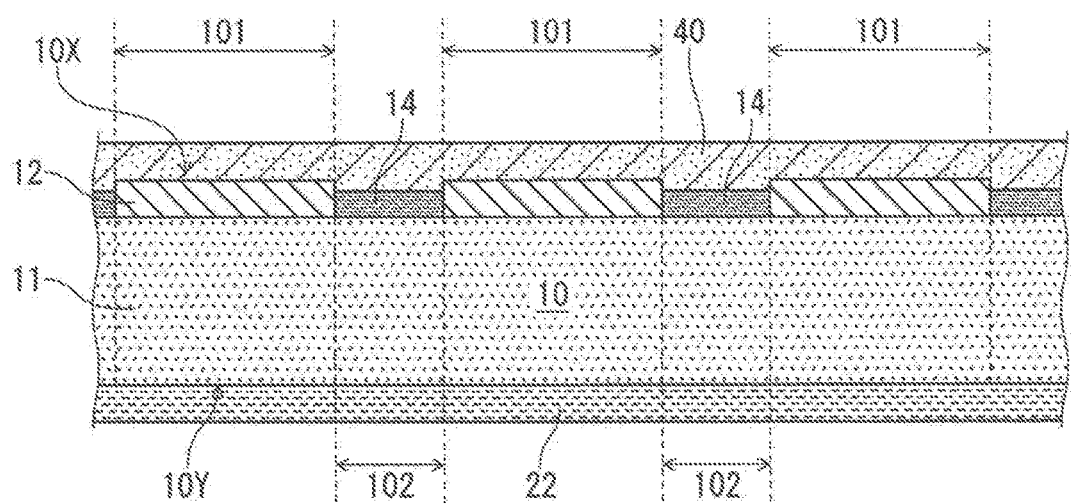
FIG. 12 is a schematic partial cross-sectional view of the substrate after a resin film formation step according to an embodiment of the present invention.

FIG. 12 is a schematic partial cross-sectional view of the substrate after the resin film formation process according to the present embodiment.

The substrate 10 has a first principal surface 10X and a second principal surface 10Y and includes a plurality of element regions 101 and dicing regions 102 defining the element regions 101. The element regions 101 include, for example, a semiconductor layer 11, and a wiring layer 12 laminated on the semiconductor layer 11 on the first principal surface 10X side. The dicing regions 102 include the semiconductor layer 11 and an electrically insulating film 14. The second principal surface 10Y of the substrate 10 is attached to the holding sheet 22 included in the conveying carrier 20. The first principal surface 10X is covered with a resin film 40.

(3) Aperture Formation Process (S13)

Apertures are formed in the resin film, so that the substrate is exposed along the dicing regions.

The apertures in the resin film formed of, for example, a photoresist can be formed by removing the resin film by photolithography along the dicing regions. In the resin film formed of a thermosetting resin or water-soluble resist, the apertures can be formed by removing the resin film by laser scribing along the dicing regions.

The apertures may be formed by removing the resin film and the electrically insulating film along the dicing regions. The removal of the insulating film along the dicing regions may be performed in a plasma dicing process as described later. In this case, the conditions for generating a plasma for removing the wiring layer can be different from that for generating a plasma for etching the substrate.

Before performing the plasma dicing process after the aperture formation process, the apertures may be irradiated with a laser beam or plasma. This is for the purpose of, for example, reducing the residue produced by the aperture formation process. This enables to perform high-quality plasma etching.

Figure 13:
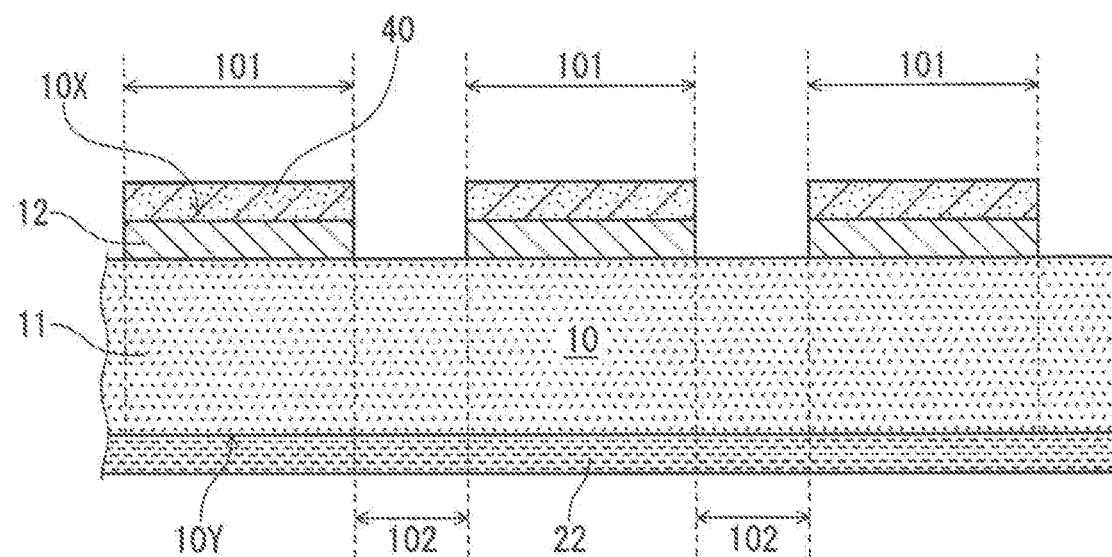
FIG. 13 is a schematic partial cross-sectional view of the substrate after an aperture formation process according to an embodiment of the present invention.

FIG. 13 is a schematic partial cross-sectional view of the substrate after the aperture formation process according to the present embodiment. The resin film 40 and the insulating film 14 are removed along the dicing regions 102 of the substrate 10, and the semiconductor layer 11 is exposed from the apertures.

(4) Plasma Dicing Process (S14)

The substrate is exposed to a plasma, so that the substrate is etched along the dicing regions exposed from the apertures, down to the second principal surface, thereby to form a plurality of element chips from the substrate. The plurality of element chips thus obtained are held on the holding sheet.

The plasma dicing process is carried out by performing the adsorption step, the frame separation step, the holding sheet separation step, and the static elimination step as described above. By this, heat-caused deterioration of the holding sheet can be suppressed.

Figure 14:
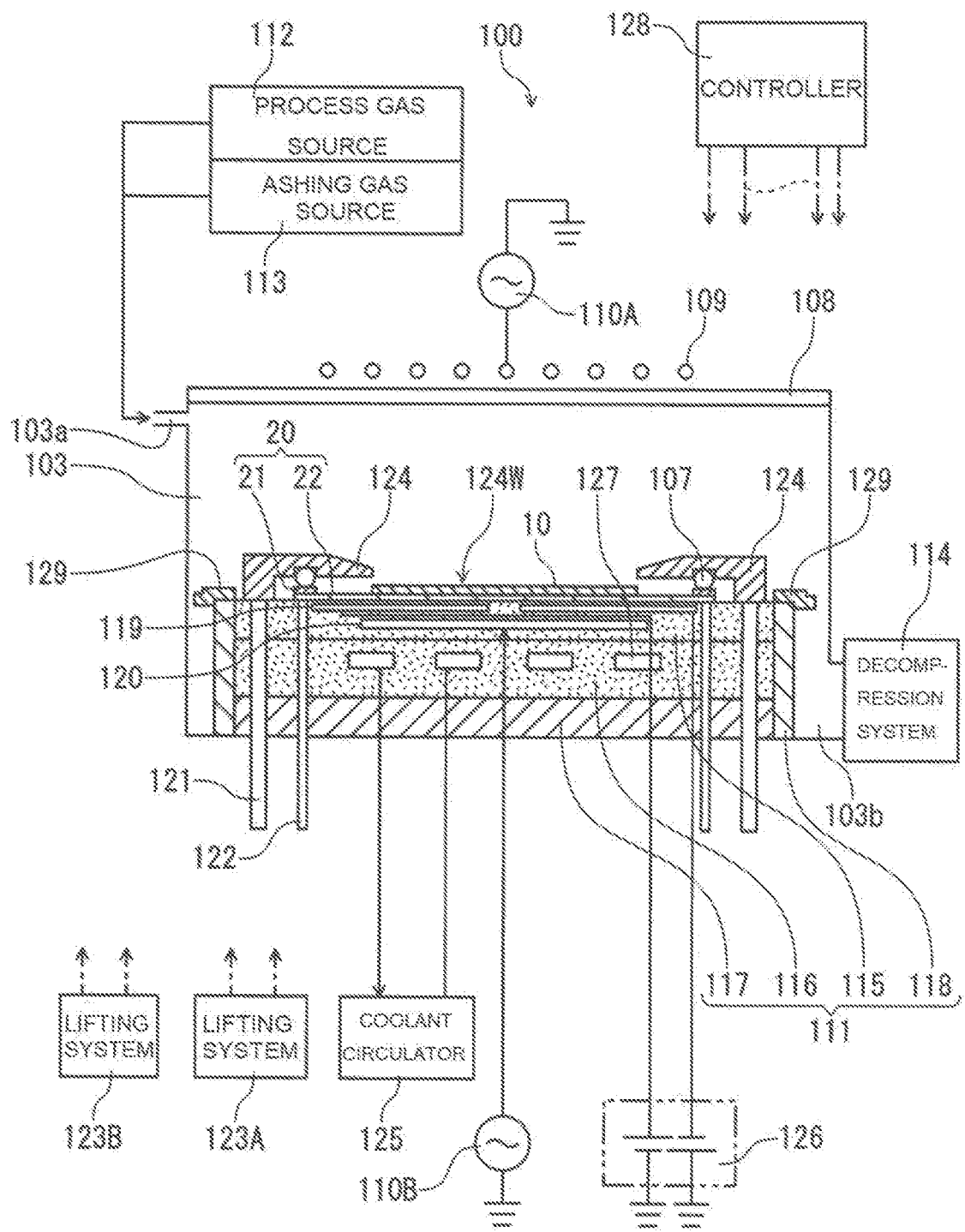
FIG. 14 is a schematic cross-sectional diagram of a plasma processing apparatus used in an embodiment of the present invention.

Referring to FIG. 14, a plasma processing apparatus 100 used for plasma etching will be specifically described below. The plasma processing apparatus is, however, not limited thereto. FIG. 14 is a schematic cross-sectional diagram of the plasma processing apparatus 100, in which the resin film 40 is not shown for the sake of convenience.

(Plasma Processing Apparatus)

The plasma processing apparatus 100 includes a vacuum chamber 103, a plasma generator, a stage 111, an electrostatic adsorption mechanism, supports 122, a lifting system (first lifting system 123A) for lifting and lowering the supports 122, and a controller 128, as described above.

The vacuum chamber 103 is, for example, approximately cylindrical in shape, with the top open. The open top is closed with a dielectric member 108 serving as a lid. Above the dielectric member 108, a first electrode 109 serving as an upper electrode is arranged. The first electrode 109 is electrically connected to a first high-frequency power source 110A.

The stage 111 is arranged on the bottom side in the vacuum chamber 103. The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, a dielectric material as exemplified above.

Within the electrode layer 115, an ESC electrode 119, and a second electrode 120 electrically connected to a second high-frequency power source 110B are disposed. The ESC electrode 119 is electrically connected to a DC power source 126. The ESC electrode 119 and the DC power source 126 constitute an electrostatic adsorption mechanism. The electrostatic adsorption mechanism fixes the substrate 10 etc., to be adsorbed to the stage 111.

The metal layer 116 is formed of, for example, aluminum with an anodic oxidation coating. The metal layer 116 contains a coolant channel 127. The coolant channel 127 cools down the stage 111. As the stage 111 is cooled down, the holding sheet 22 set on the stage 111 is cooled down. This protects the substrate 10 and the holding sheet 22 from being damaged by being heated during etching. The coolant in the coolant channel 127 is circulated by a coolant circulator 125.

In the vicinity of the outer periphery of the stage 111, a plurality of the supports 122 penetrating through the stage 111 are provided. The supports 122 support the frame 21 of the conveying carrier 20. The supports 122 are driven to move up and down by the first lifting system 123A.

Above the stage 111, a cover 124 having a window 124W for exposing at least part of the substrate 10 therefrom is arranged. The cover 124 is provided with pressure members 107 for pushing the frame 21 downward while the frame 21 is on the stage 111. The pressure members 107 are preferably a member that can achieve point contact with the frame 21 (e.g., a coil spring or an elastic resin). This can correct a distortion of the frame 21, while restricting a thermal communication between the frame 21 and the cover 124.

A plurality of lifting rods 121 are coupled to the cover 124 at its peripheral end, so that the cover 124 can be lifted and lowered. The lifting rods 121 are driven to move up and down by the second lifting system 123B. The lifting and lowering operation of the cover 124 by the second lifting system 123B can be controlled independently from the operation by the first lifting system 123A.

The cover 124 has, for example, a doughnut-like shape with approximately circular contour, and has a predetermined width and a thin thickness. The diameter of the window 124W is smaller than the inner diameter of the frame 21, and the outer diameter thereof is larger than the outer diameter of the frame 21. Therefore, when the cover 124 is lowered while the conveying carrier 20 is seated at a predetermined position on the stage 111, the cover 124 can cover the frame 21. From the window 124W, at least part of the substrate 10 is exposed.

The cover 124 is formed of, for example, a dielectric, such as ceramics (e.g., alumina, aluminum nitride) or quarts, or a metal, such as aluminum or aluminum with an anodic oxidation coating. The pressure members 107 can be formed of the aforementioned dielectric or metal, or a resin material.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113. The gas outlet 103b is connected to a decompression system 114 including a vacuum pump for exhausting gas from the vacuum chamber 103 to reduce the pressure therein.

The conditions for generating a plasma for etching the semiconductor layer are set depending on the material of the semiconductor layer and other factors.

The semiconductor layer is plasma-etched by, for example, a Bosch process. In the Bosch process, the semiconductor layer is etched vertically in the depth direction. When the semiconductor layer contains Si, the Bosch process sequentially repeats a film deposition step, a deposited-film etching step, and a Si etching step, to dig the semiconductor layer in the depth direction.

The film deposition step is carried out, for example, under the following conditions: while supplying $C_4F_8$ as a process gas at a rate of 150 sccm or more and 1000 sccm or less, the pressure in the vacuum chamber is controlled to 10 Pa or more and 25 Pa or less, with the input power to the first electrode from the first high-frequency source set at 1500 W or more and 4800 W or less, and the input power to the second electrode from the second high-frequency power source set at 0 W or more and 50 W or less; and the processing time is 2 s or more and 15 s or less.

The deposited-film etching step is carried out, for example, under the following conditions: while supplying $SF_6$ as a process gas at a rate of 200 sccm or more and 1000 sccm or less, the pressure in the vacuum chamber is controlled to 5 Pa or more and 15 Pa or less, with the input power to the first electrode from the first high-frequency power source set at 1500 W or more and 4800 W or less, and the input power to the second electrode from the second high-frequency power source set at 0 W or more and 1000 W or less; and the processing time is 2 s or more and 10 s or less.

The Si etching step is carried out, for example, under the following conditions: while supplying $SF_6$ as a process gas at a rate of 200 sccm or more and 1000 sccm or less, the pressure in the vacuum chamber is controlled to 5 Pa or more and 15 Pa or less, with the input power to the first electrode from the first high-frequency power source set at 1500 W or more and 4800 W or less, the input power to the second electrode from the second high-frequency power source set at 10 W or more and 500 W or less; and the processing time is 5 s or more and 20 s or less.

By repeating the film deposition step, the deposited-film etching step, and the Si etching step under the conditions as above, the semiconductor layer containing Si can be etched vertically in the depth direction at a rate of 10 μm/min or more and 20 μm/min or less.

Figure 15:
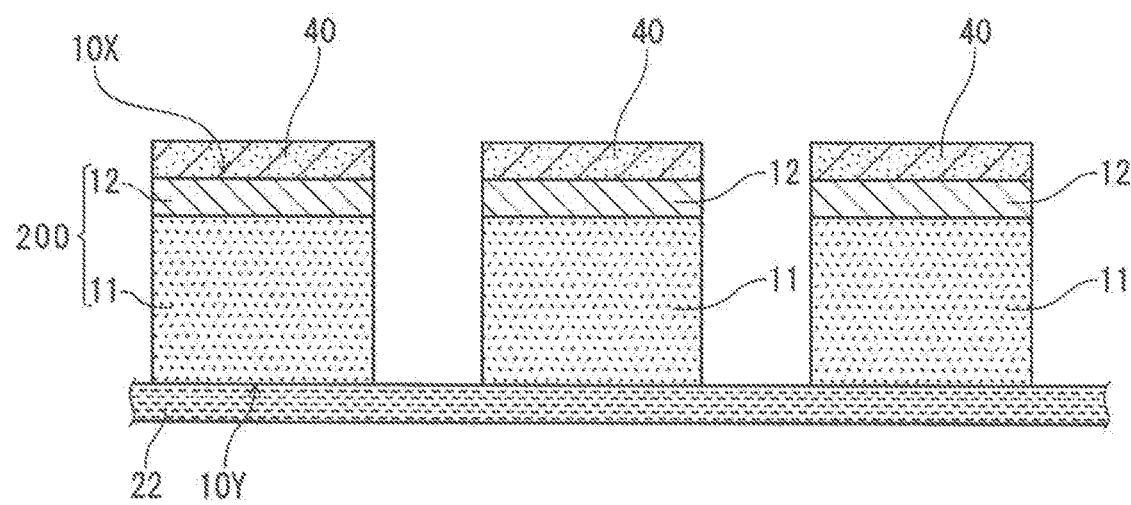
FIG. 15 is a schematic cross-sectional view of element chips obtained by a plasma dicing process according to an embodiment of the present invention.

FIG. 15 is a schematic cross-sectional view of element chips obtained by the plasma dicing process according to the present embodiment. The substrate has been etched along the dicing regions, so that a plurality of the element chips 200 are formed. The wiring layer 12 of each element chip 200 is covered with the resin film 40.

(5) Resin Film Removal Process (S15)

The resin film is removed after the plasma dicing process.

When the resin film is soluble in water, the resin film can be removed by washing with water. Instead of washing with water, ashing may be performed in the plasma processing apparatus, to remove the resin film. In this case, the ashing is performed after the etching step and before the frame separation step.

In the ashing, after the vacuum chamber is evacuated, a process gas for ashing (e.g., oxygen gas ($O_2$), a mixed gas of $O_2$ gas and fluorine-containing gas) is introduced from an ashing gas source into the vacuum chamber. Subsequently, a high-frequency power is fed from the first high-frequency power source to the first electrode. This generates an oxygen plasma within the vacuum chamber, so that the resin film is removed from the surfaces of the element chips.

Specifically, the ashing is performed under the following conditions: while supplying a mixed gas of $CF_4$ and $O_2$ as an ashing gas (flow rate of $CF_4:O_2=1:10$) at a flow rate of 150 sccm or more and 300 sccm or less, the pressure in the vacuum chamber is controlled to 5 Pa or more and 15 Pa or less, with the input power to the first electrode from the first high-frequency source set at 1500 W or more and 5000 W or less, and the input power to the second electrode from the second high-frequency power source set at 0 W or more and 300 W or less. The input power to the second electrode in the ashing step is desirably set smaller than that in the etching step.

Figure 16:
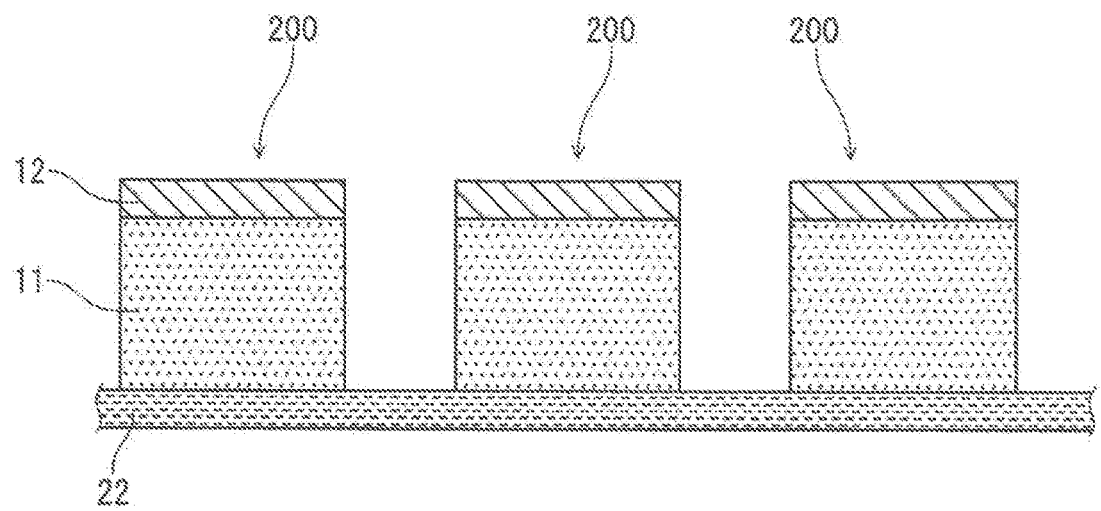
FIG. 16 is a schematic cross-sectional view of element chips after a resin film removal step according to an embodiment of the present invention.

FIG. 16 is a schematic cross-sectional view of element chips produced by the resin film removal step according to the present embodiment. The resin film 40 has been removed from the wiring layer 12.

After the resin film removal process, the element chips are detached from the holding sheet.

The element chips are, for example, thrust upward together with the holding sheet with thrust-up pins from the non-adhesive side of the holding sheet. This allows at least part of the element chip to float from the holding sheet. The element chips are then detached from the holding sheet by a pickup device.

According to the present invention, heat-caused deterioration of the holding sheet can be suppressed. The present invention is therefore suitably applicable particularly to a method of manufacturing element chips by plasma dicing using a conveying carrier.

REFERENCE NUMERALS

10: substrate
10X: first principal surface
10Y: second principal surface
11: semiconductor layer
12: wiring layer
14: insulating film
20: conveying carrier
21: frame
21a: notch
21b: corner cut
22: holding sheet
22X: adhesive side
22Y: non-adhesive side
40: resin film
100: plasma processing apparatus
103: vacuum chamber
103b: gas outlet
108: dielectric member
109: first electrode
110A: first high-frequency power source
110B: second high-frequency power source
111: stage
112: process gas source
113: ashing gas source
114: decompression system
115: electrode layer
116: metal layer
117: base table
118: peripheral member
119: ESC electrode
120: second electrode
121: lifting rod
122: support
123A, 123B: lifting system
124: cover
124W: window
125: coolant circulator
126: DC power source
127: coolant channel
128: controller
129: circumferential ring
200: element chip

What is claimed is:

1. A plasma processing apparatus for plasma processing a substrate held on a conveying carrier,
the conveying carrier including a holding sheet, and a frame supporting an outer periphery of the holding sheet,
the substrate being attached to the holding sheet,
the plasma processing apparatus comprising:
a reaction chamber;
a plasma generator for generating a plasma within the reaction chamber;
a stage for mounting the conveying carrier, the stage arranged inside the reaction chamber;
an electrostatic adsorption mechanism including an electrode part arranged inside the stage;
a support for supporting the frame;
a lifting system for lifting and lowering the support; and
a controller for controlling the plasma generator, the electrostatic adsorption mechanism, and the lifting system, wherein
the controller controls the plasma generator, the electrostatic adsorption mechanism, and the lifting system, to sequentially execute:
an adsorption step of applying a voltage to the electrode part while the conveying carrier holding the substrate is on the stage, to allow the substrate to be adsorbed electrostatically to the stage;
an etching step of exposing the substrate adsorbed electrostatically to the stage to an etching plasma;
a frame separation step of lifting the support, to separate the frame away from the stage, with at least part of the holding sheet kept in contact with the stage;
a holding sheet separation step of applying to the electrode part a voltage that generates a repulsive force between the substrate and the electrode part, to separate the holding sheet away from the stage; and
a static elimination step of exposing the substrate separated away from the stage to a static elimination plasma.

2. The plasma processing apparatus according to claim 1, wherein the voltage applied in the holding sheet separating step has a polarity different from a polarity of the voltage applied to the electrode part in the etching step.

3. The plasma processing apparatus according to claim 1, wherein the electrode part is arranged at a position not facing the frame.

4. The plasma processing apparatus according to claim 1, wherein the controller controls to execute a lifting step of further lifting the support, after the holding sheet separation step and before the static elimination step.

5. A plasma processing method for plasma processing a substrate held on a conveying carrier,
the conveying carrier including a holding sheet and a frame supporting an outer periphery of the holding sheet,
the substrate being attached to the holding sheet,
the plasma processing method comprising:
an adsorption step of applying a voltage to an electrode part while the conveying carrier holding the substrate is on the stage, to allow the substrate to be adsorbed electrostatically to the stage;
an etching step of exposing the substrate adsorbed electrostatically to the stage to an etching plasma;
a frame separation step of lifting the support, to separate the frame away from the stage, with at least part of the holding sheet kept in contact with the stage;
a holding sheet separation step of applying to the electrode part a voltage that generates a repulsive force between the substrate and the electrode part, to separate the holding sheet away from the stage; and
a static elimination step of exposing the substrate separated away from the stage to a static elimination plasma.

6. The plasma processing method according to claim 5, wherein the voltage applied in the holding sheet separating step has a polarity different from a polarity of the voltage applied to the electrode part in the etching step.

7. The plasma processing method according to claim 5, further comprising a lifting step of further lifting the support, after the holding sheet separation step and before the static elimination step.

8. An element chip manufacturing method, comprising:
- a preparation process of preparing a conveying carrier and a substrate, the conveying carrier including a holding sheet and a frame supporting an outer periphery of the holding sheet, the substrate being held on the holding sheet and segmented into a plurality of element regions and a plurality of dicing regions, and having a first principal surface and a second principal surface attached to the holding sheet; and
- a plasma dicing process of exposing the substrate to an etching plasma, to remove the dicing regions from the substrate to dice the substrate into a plurality of element chips, the plasma dicing process including:
- an adsorption step of applying a voltage to an electrode part while the conveying carrier holding the substrate is on the stage, to allow the substrate to be adsorbed electrostatically to the stage;
- an etching step of exposing the substrate adsorbed electrostatically to the stage to an etching plasma;
- a frame separation step of lifting the support, to separate the frame away from the stage, with at least part of the holding sheet kept in contact with the stage;
- a holding sheet separation step of applying to the electrode part a voltage that generates a repulsive force between the substrate and the electrode part, to separate the holding sheet away from the stage; and
- a static elimination step of exposing the substrate separated away from the stage to a static elimination plasma.

* * * * *